US012610592B2

(12) United States Patent
Karalkar et al.

(10) Patent No.: US 12,610,592 B2
(45) Date of Patent: Apr. 21, 2026

(54) STRUCTURE WITH BURIED DOPED REGION AND METHODS TO FORM SAME

(71) Applicant: GlobalFoundries U.S. Inc., Malta, NY (US)

(72) Inventors: Sagar Premnath Karalkar, Essex Junction, VT (US); Jie Zeng, Singapore (SG); Souvick Mitra, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 592 days.

(21) Appl. No.: 18/056,289

(22) Filed: Nov. 17, 2022

(65) Prior Publication Data

US 2024/0170531 A1 May 23, 2024

(51) Int. Cl.
*H10D 89/60* (2025.01)
*H10D 62/10* (2025.01)

(52) U.S. Cl.
CPC ........... *H10D 62/107* (2025.01); *H10D 89/60* (2025.01)

(58) Field of Classification Search
CPC ........ H10D 62/107; H10D 89/60; H10D 8/00; H10D 10/60; H10D 8/021; H10D 62/111; H10D 89/711; H10D 89/921; H10D 62/051
See application file for complete search history.

(56) References Cited

U.S. PATENT DOCUMENTS

| | | |
|---|---|---|
| 5,326,710 A | 7/1994 | Joyce et al. |
| 5,907,174 A | 5/1999 | Lee et al. |
| 7,875,933 B2 | 1/2011 | Schneider et al. |
| 10,037,988 B1 | 7/2018 | Solaro et al. |
| 10,224,411 B2 | 3/2019 | Mallikarjunaswamy et al. |
| 2003/0085429 A1* | 5/2003 | Hulfachor ............ H10D 89/815 |
| | | 257/369 |
| 2014/0210007 A1* | 7/2014 | Deval .................. H10D 86/201 |
| | | 257/350 |
| 2018/0082994 A1 | 3/2018 | Han et al. |
| 2020/0035665 A1* | 1/2020 | Chuang ................ H10D 89/711 |
| 2020/0098741 A1* | 3/2020 | Zeng .................... H10D 62/142 |
| 2021/0327869 A1* | 10/2021 | Zeng .................... H10D 62/822 |

(Continued)

OTHER PUBLICATIONS

Khemka et al., A Floating RESURF (FRESURF) LD-MOSFET Device Concept, Oct. 10, 2003, IEEE Electron Device Letters, vol. 24, No. 10, pp. 664-666 (Year: 2003).*

(Continued)

*Primary Examiner* — William B Partridge
*Assistant Examiner* — Erik A. Anderson
(74) *Attorney, Agent, or Firm* — Francois Pagette; Hoffman Warnick LLC

(57) ABSTRACT

The disclosure provides a structure with a buried doped region, and methods to form the same. A structure may include a semiconductor substrate including a first well. A first terminal includes a first doped region in the first well. A second terminal includes a second doped region in the first well. The first well horizontally separates the first doped region from the second doped region. A first buried doped region is in the first well. The first buried doped region overlaps with, and is underneath, the first doped region. The first well vertically separates the first doped region from the first buried doped region.

19 Claims, 7 Drawing Sheets

(56) References Cited

U.S. PATENT DOCUMENTS

2024/0047569 A1* 2/2024 Chen ................. H10D 62/8325

OTHER PUBLICATIONS

European Search Report for corresponding EP Application No. 23192845.8-1020 dated Feb. 13, 2024, 8 pages.
Vashchenko et al., "Multi-Port ESD Protection Using Bi-Directional SCR Structures," IEEE 2003, pp. 137-140.
European Communication for corresponding EP Application No. 23192845.8-1001 dated Dec. 18, 2025, 7 pages.

* cited by examiner

STRUCTURE WITH BURIED DOPED REGION AND METHODS TO FORM SAME

BACKGROUND

1. Technical Field

The present disclosure provides integrated circuit structures with a buried doped region, e.g., within an electrostatic discharge (ESD) protection structure, and methods to form the same.

2. Background Art

Present technology is at atomic level scaling of certain micro-devices such as logic gates, bipolar transistors, field effect transistors (FETs), and capacitors. Circuit chips with millions of such devices are common. Some devices for routing excess current away from sensitive components, e.g., electrostatic discharge devices (ESDs), are designed to be electrically active only in specific operating circumstances. That is, ESDs and similar devices must not trigger at too low a voltage to operate in safe situations, or at too high a voltage to operate in unsafe situations. Some ESD protective circuits or similar devices having bipolar devices (e.g., alternatingly doped materials defining a PNP structure) may have an unacceptably high resistance when activated. In addition, such devices may only support flow of current in one direction and hence cannot support positive and negative voltage biases. Conventional approaches for mitigating these concerns have disadvantages, e.g., a larger surface area is required to accommodate the ESD protective circuit(s).

SUMMARY

The illustrative aspects of the present disclosure are designed to solve the problems herein described and/or other problems not discussed.

Embodiments of the disclosure provide a structure including: a semiconductor substrate including a first well; a first terminal including a first doped region in the first well; a second terminal including a second doped region in the first well, wherein the first well horizontally separates the first doped region from the second doped region; and a first buried doped region in the first well, the first buried doped region overlapping with and underneath the first doped region, wherein the first well vertically separates the first doped region from the first buried doped region.

Further embodiments of the disclosure provide a structure including: a semiconductor substrate including a first well; a first terminal including a first doped region in the first well; a second terminal including a second doped region in the first well, wherein the first well horizontally separates the first doped region from the second doped region; a first buried doped region in the first well, the first buried doped region overlapping with and underneath the first doped region, wherein the first well vertically separates the first doped region from the first buried doped region; a second buried doped region in the first well, the second buried doped region overlapping with and underneath the second doped region, wherein the first well vertically separates the first doped region from the second buried doped region; and an insulator layer on the first well and horizontally separating a portion of the first terminal from a portion of the second terminal.

Additional embodiments of the disclosure provide a method including: forming a semiconductor substrate including a first well; forming a first terminal including a first doped region in the first well; forming a second terminal including a second doped region in the first well, wherein the first well horizontally separates the first doped region from the second doped region; and forming a first buried doped region in the first well, the first buried doped region overlapping with and underneath the first doped region, wherein the first well vertically separates the first doped region from the first buried doped region.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
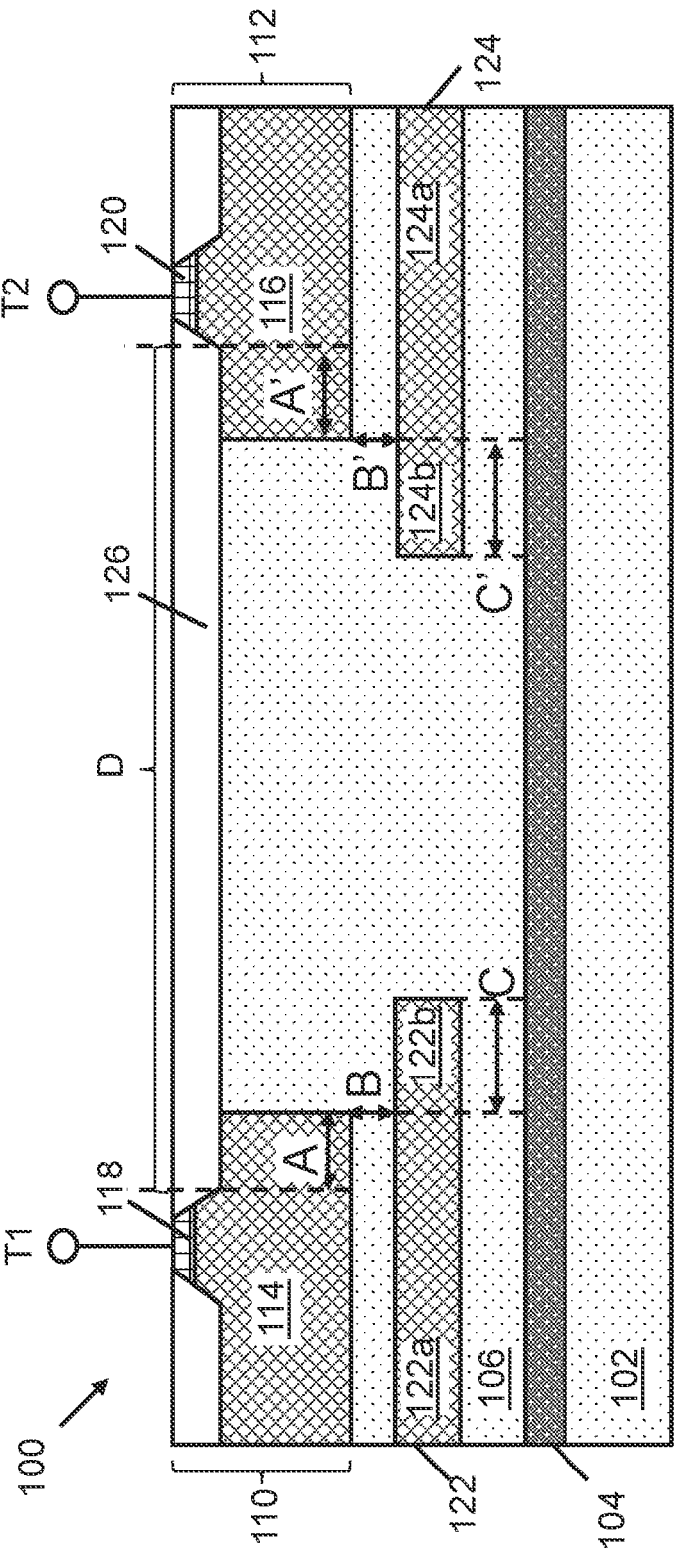
FIG. 1 depicts a cross-sectional view of a structure according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described to best explain the principles of the disclosure and the practical application, and to enable others of ordinary skill in the art to understand the disclosure for various embodiments with various modifications as are suited to the particular use contemplated.

Embodiments of the disclosure provide a structure including a buried doped region below one or more terminals of a device, e.g., a P-N-P structure for electrostatic discharge (ESD) protection circuits. Structures according to the disclosure may have a semiconductor substrate with a first well therein. A first terminal includes a first doped region within the first well. A second terminal includes a second doped region within the first well, such that the first well horizontally separates the first doped region from the second doped region. The doping types of the first doped region, first well, and second doped region together may define a P-N-P doping arrangement within the substrate. A buried doped region is also in the first well, overlapping with and underneath the first doped region. The first well vertically separates the first doped region from the first buried doped region, thus preventing the first doped region from shorting to the first buried doped region. The buried doped region, when placed below electrically active semiconductor materials, will expand and relax the electric field to increase the trigger current needed to enable current flow through the P-N-P device. Among other benefits, structures of the disclosure offer a "bi-directional" device capable of being triggered under sufficient positive or negative voltage biasing.

IC structures according to the disclosure may operate using multiple "P-N junctions." The term "P-N" refers to two adjacent materials having different types of conductivity (i.e., P-type and N-type), which may be induced through dopants within the adjacent material(s). A P-N junction, when formed in a device, may operate as a diode. A diode is a two-terminal element, which behaves differently from conductive or insulative materials between two points of electrical contact. Specifically, a diode provides high conductivity from one contact to the other in one voltage bias direction (i.e., the "forward" direction), but provides little to no conductivity in the opposite direction (i.e., the "reverse" direction). In the case of the P-N junction, the orientation of a diode's forward and reverse directions may be contingent on the type and magnitude of bias applied to the material composition of one or both terminals, which affect the size of the potential barrier. In the case of a junction between two semiconductor materials, the potential barrier will be formed along the interface between the two semiconductor materials. Three adjacent materials having respective voltage polarities may be combined to form a pair of diodes, thus providing a "P-N-P" structure in which each of the pair of diodes is defined between the n-doped material and one of two regions of p-doped material.

Referring to FIG. 1, an integrated circuit (IC) structure (simply "structure" hereafter) 100, according to embodiments of the disclosure, is shown. Structure 100 is formed on a substrate 102 including, e.g., one or more semiconductor materials. Substrate 102 may include but is not limited to silicon, germanium, silicon germanium (SiGe), silicon carbide, or any other common integrated circuit (IC) semiconductor substrates. In the case of SiGe, the germanium concentration in substrate 102 may differ from other SiGe-based structures described herein. A portion or entirety of substrate 102 may be strained.

Various components (e.g., various doped wells, doped semiconductor materials, trench isolation regions, etc.) may be formed above an buried doped layer 104 on substrate 102. Buried doped layer 104 may be formed on or within substrate 102, e.g., by converting a portion of semiconductor material within substrate 102 into a higher-resistive material such as amorphous semiconductor (e.g., a-Si) or polycrystalline semiconductor (e.g., poly-Si). Buried doped layer 104 may extend horizontally throughout substrate 102, and/or may be formed selectively under locations where doped materials are formed, examples of which are discussed elsewhere herein. In further implementations, buried doped layer 104 may include the same or similar material(s) present in substrate 102, but may include a higher concentration of dopants therein. In an example implementation, buried doped layer 104 may be doped n-type to provide an n-type layer over substrate 102. However embodied, buried doped layer 104 may be sized as narrow as possible to provide better interaction with overlying semiconductor materials, and in various embodiments may have a thickness that is at most approximately twenty-five nanometers (nm) to approximately five-hundred nm. Some portions of substrate 102 may not have buried doped layer 104, and/or multiple buried doped layers 104 may be formed within substrate 102 at different positions.

Various conductive particles ("dopants") may be introduced into semiconductor material(s) of or above substrate 102 and/or buried doped layer 104, e.g., to define a first well (also known as a "deep well") 106 therein. A "dopant" refers to an element introduced into semiconductor to establish either p-type (acceptors) or n-type (donors) conductivity. In the case of a silicon substrate, common dopants may include, e.g., boron (B), and/or indium (In), for p-type doping. For n-type doping, the doped element(s) may include, for example, phosphorous (P) arsenic (As), and/or antimony (Sb). Doping is the process of introducing impurities (dopants) into the semiconductor substrate, or elements formed on the semiconductor substrate, and is often performed with a mask (e.g., a film of photoresist material and/or other component to block dopants) in place so that only certain areas of the substrate will be doped. In the example of doping by implantation, an ion implanter may be employed. In further examples, in-situ doping or other doping techniques may be used.

In doping processes, a doping type, a dopant species, a dosage, and an energy level are specified and/or a resulting doping level may be specified. A dosage may be specified in the number of atoms per square centimeter ($cm^2$) and an energy level (specified in keV, kilo-electron-volts), resulting in a doping level (concentration in the substrate) of a number of atoms per cubic centimeter ($cm^3$). The number of atoms is commonly specified in exponential notation, where a number like "3E15" means 3 times 10 to the 15th power, or a "3" followed by 15 zeroes (3,000,000,000,000,000). An example of doping is implanting with B (boron) with a dosage of between about 1E12 and 1E13 atoms/$cm^2$, and an energy of about 40 to 80 keV to produce a doping level of between 1E17 and 1E18 atoms/$cm^3$.

Doped portions of a substrate may be known in the art as a "well." A well commonly refers to the implanted/diffused region in semiconductor wafer needed to implement a complementary metal oxide semiconductor (CMOS) cell. A "deep well" refers to doped semiconductor material located underneath active device components and/or other wells. A "shallow well," similar to a deep well, is an area of doped semiconductor material located beneath active device components but not to the same depth as a deep well. Hence, it is possible for a highly doped active semiconductor material to be located inside of a shallow well or deep well, and/or for the shallow well in turn to be located inside of a deep well. Depending on the attributes of a device to be manufactured, portions of semiconductor material on or over substrate 102 may be either n-type or p-type doped as discussed herein.

Various semiconductor materials above buried doped layer 104 may be doped, based on the intended polarity and/or intended characteristics of device structures formed thereon. For example, first well 106 may have a predetermined polarity (e.g., n-type doping to provide a P-N-P device as discussed herein). First well 106 initially may be formed within an entire thickness of substrate 102 over buried doped layer 104 as discussed elsewhere herein, but this is not necessarily required. Additional doped material(s) and/or structures may be formed within various portions of first well 106, to define electrical pathways within an electrical circuit. Other materials may be formed to electrically bias and/or influence current flow through first well 106, and additional doped regions therein, without fundamentally changing the function of doped elements and/or affecting other structures. Where buried doped layer 104 is present, a remainder of semiconductor material below buried doped layer 104 may define substrate 102.

Structure 100 may include a first terminal 110 and a second terminal 112 in respective portions of first well 106. First terminal 110 may include a first doped region 114 in first well 106, and second terminal 112 may include a second doped region 116 in another portion of first well 106 that is horizontally distal to first doped region 114. Regions 114, 116 in some contexts may be known as a "drift region," i.e., semiconductor material that is doped such that it cannot be conductive until a voltage is applied thereto. A portion of first well 106 may horizontally separate first doped region from second doped region 116. Thus, an electrical pathway from first doped region 114 to second doped region 116, or vice versa, includes at least a portion of first well 106. Each doped region 114, 116 may include a doped semiconductor material having a doping type other than that of first well 106. To provide a P-N-P device D within structure 100, doped regions 114, 116 may be doped p-type in the case where first well 106 is doped n-type. First terminal 110 optionally may include an overlying region 118 thereover, in which overlying region 118 has a same doping type as first region 114 but a substantially higher doping concentration. In an example where first region 114 is doped p-type, overlying region 118 may be a highly doped "p+" region featuring excess holes. Similarly, second doped region 116 may have an overlying region 120 thereover, in which second doped region 116 and overlying region 120 have the same doping type. Thus, overlying region 120 may be a highly doped p+ region in the case where second doped region 116 is doped p-type. Overlying regions 118, 120 may be relatively conductive to enable strong electrical coupling to conductive materials formed thereon, e.g., one or more metal wires or vias. Overlying regions 118, 120 additionally may be provided to induce diffusion current (i.e., current flow from a more highly doped region to a less highly doped region) within terminals 110, 112. Couplings to terminals 110, 112 from other portions of a device or circuit are indicated in FIG. 1 using nodes T1, T2, respectively, and may be provided using any currently known or later developed electrical connection(s).

First doped region 114 may be wider than first overlying region 118. A horizontal offset distance A between the horizontal end of first doped region 114 and first overlying region 118 may be, e.g., between approximately 0.5 micrometers (μm) and approximately 2.0 μm. Second doped region 116 similarly may be wider than second overlying region 120, and the horizontal ends of each region 116, 120 may be offset by a same or similar distance A' as horizontal offset distance A.

Structure 100 additionally may include a first buried doped region 122 within first well 106 and below first terminal 110. In some cases, first buried doped region 122 may be considered to be a "floating" doped region. The term "floating," in this context, refers to first buried doped region 122 being within first well 106 but not coupled to and/or otherwise contacted by other electrically active materials. First buried doped region 122, simply by being present within structure 100, will extend the electric field within first terminal 110 when a trigger current or voltage is applied thereto. First buried doped region 122 may have a same doping type as first doped region 114 of first terminal 110. First buried doped region 122 is structurally distinct from first doped region 114 thereover, and a portion of first well 106 may be vertically between regions 114, 122 to prevent electrical shorting therebetween. A vertical thickness B of first well 106 between regions 114, 122 may vary between implementations, and in an example may be between approximately 0.5 μm and approximately 1.5 μm. Structure 100 may also include a second buried doped region 124 that is similarly within first well 106 and below second doped region 116. A vertical thickness B' of first well 106 between regions 116, 124 may be the same as or similar to vertical thickness B between regions 114, 122.

A portion 122a of first buried doped region 122 may vertically overlap with first terminal 110 along its length. Another portion 122b of first buried doped region 122 may extend laterally beyond first doped region 114 of first terminal 110, and thus portion 122b may not overlap with first doped region 114. Portion 122b of first buried doped region 122 may have a horizontal width C of, e.g., between approximately 0.5 μm and approximately 2.0 μm. Second buried doped region 124 similarly may be subdivided into portions 124a, 124b, respectively overlapping and non-overlapping with second doped region 116 thereover. Portion 124b of second floating doped region 124 may have a horizontal width C' that is similar or substantially equal to horizontal width C of portion 122b. By including portions 122b, 124b which do not vertically overlap with regions 114, 116 thereover, the composition of buried doped regions 122, 124 will further extend any induced electrical fields within terminals 110, 112 during operation of structure 100.

Structure 100 additionally may include an insulator layer 126 over first well 106 and doped regions 114, 116 therein. Insulator layer 126 may include, e.g., any insulating material(s) discussed above regarding buried doped layer 104 such as any of various oxide or nitride-based insulators. Insulator layer 126 also may extend horizontally between overlying regions 118, 120 to electrically separate nodes T1, T2 from each other. Although insulator layer 126 is shown by example as extending continuously over first well 106 and between overlying regions 118, 120, this is not necessarily required in all implementations.

Figure 2:
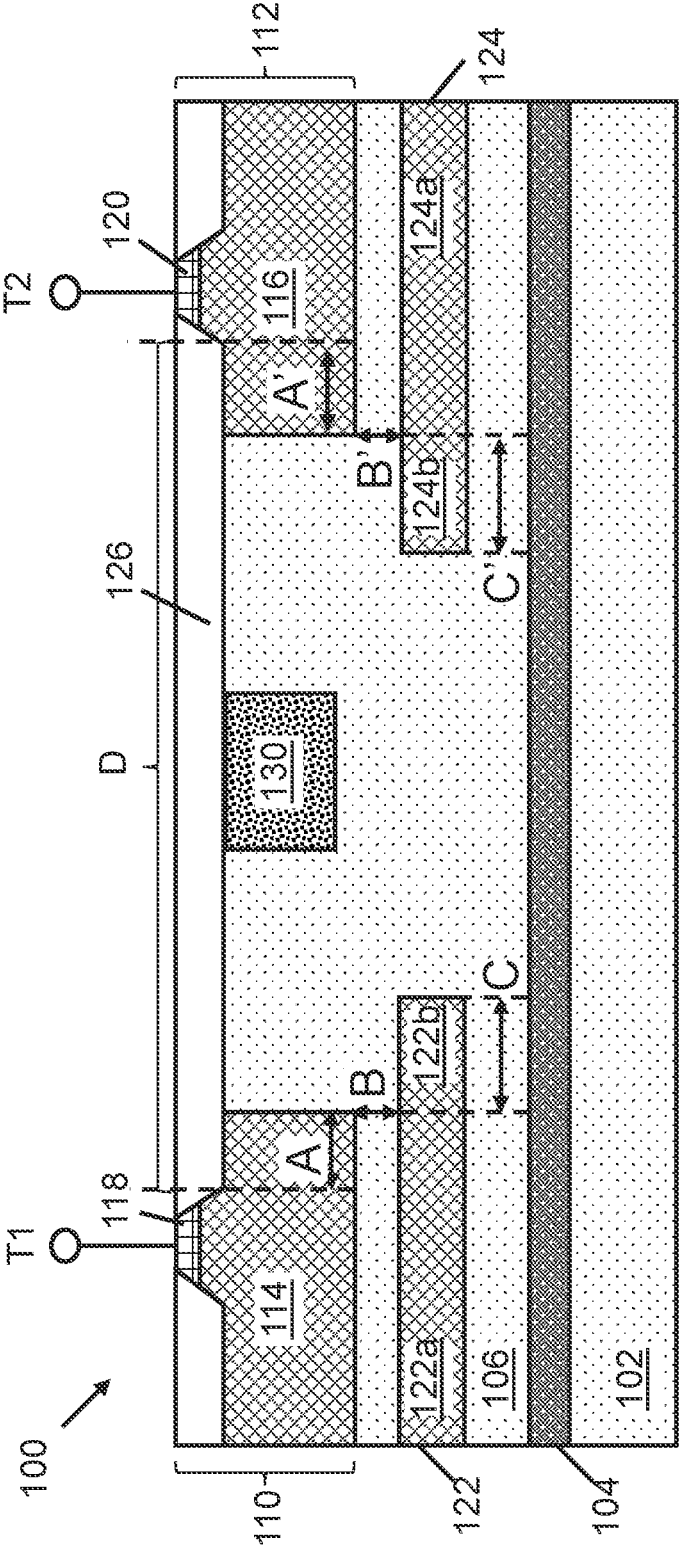
FIG. 2 depicts a cross-sectional view of a structure with a second well according to further embodiments of the disclosure.

FIG. 2 depicts a further implementation of structure 100, in which a second well 130 is within first well 106. Second well 130 may have a same doping type as first well 106, e.g., it may be doped n-type in the case where first well 106 is doped n-type. Second well 130, however, may have a significantly higher dopant concentration than first well 106. Second well 130 thus may be embodied as an "n+" region defined by excess doping of first well 106 in a particular position. Portions of first well 106 may horizontally separate second well 130 from first terminal 110 and second terminal 112, such that neither terminal 110, 112 is adjacent or within second well 130. Second well 130, when included, may operate to strongly define the n-type region within P-N-P device D. Similar to buried doped regions 122, 124, second well 130 may not have a distinct contact or electrical coupling thereto, and instead is within first well 130 to better define an electrical pathway between terminals 110, 112 of structure 100. Second well 130 also may have insulator layer 126 thereover to prevent electrical shorting from either of nodes T1, T2 to second well 130.

Figure 3:
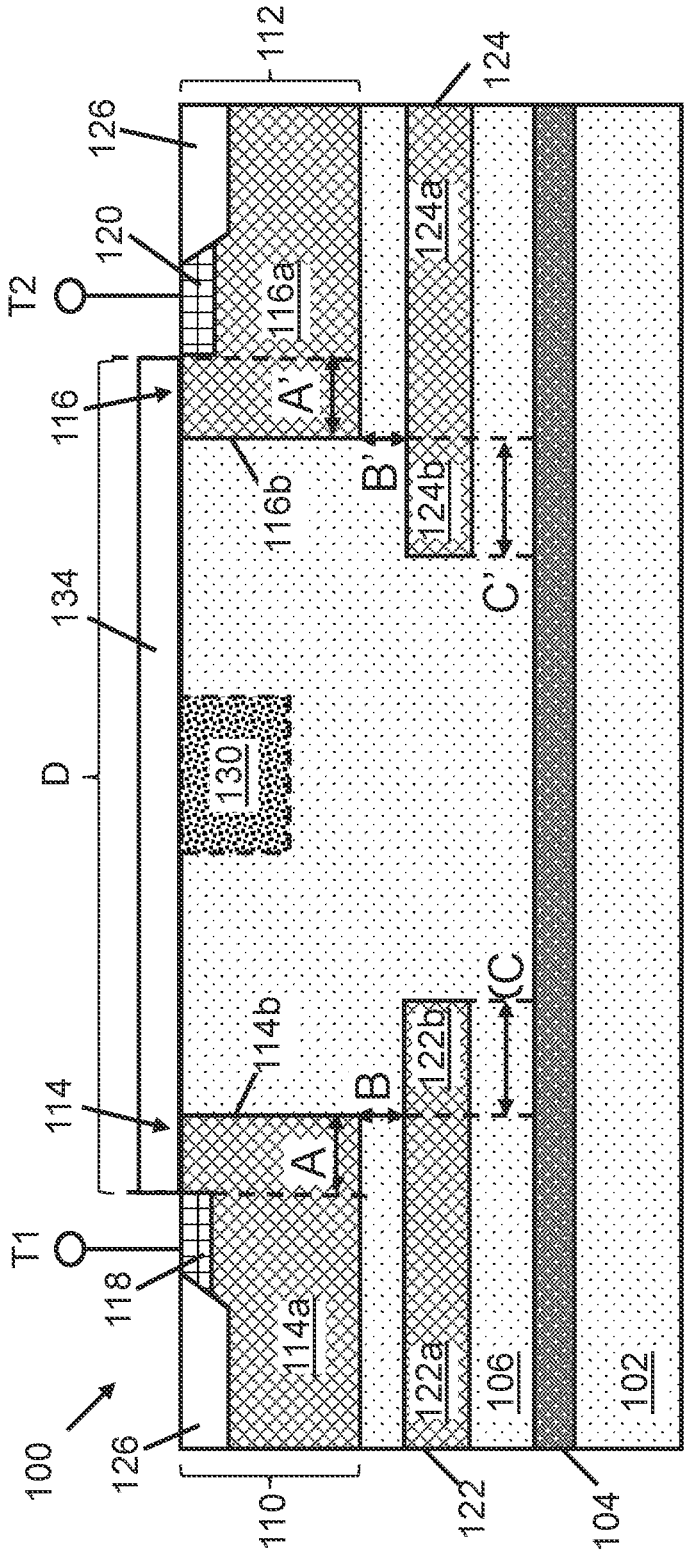
FIG. 3 depicts a cross-sectional view of a structure with an overlying insulator layer according to still further embodiments of the disclosure.

FIG. 3 depicts a further implementation of structure 100 in which first doped region 114 and second doped region 116 each may be subdivided into a first portion 114a, 116b and a second portion 114b, 116b having distinct physical characteristics. First portions 114a, 116a of each region 114, 116 may be substantially similar to how regions 114, 116 are shaped in other implementations, i.e., they may be below a respective overlying region 118, 120 and a portion of insulator layer 126. Second portion 114*b*, 116*b* of each region 114, 116 however may be located between first portion 114*a*, 116*b* and an adjacent area of first well 106, respectively. Second portion(s) 114*b*, 116*b* may span offset distance A of each region 114, 116 and may extend above the top of first portion(s) 114*a*, 116*a* such that they are partially adjacent overlying region(s) 118, 120. In this case, silicide blocking layer 134 (e.g., any currently known or later developed insulative material(s), such as silicon dioxide (SiO₂) configured to prevent growth of silicide and/or other conductors thereon) may be over second portion(s) 114*b*, 116*b* and well(s) 106, 130. First well 130 is depicted with dashed lines in FIG. 3 to illustrate that it may be omitted in some implementations. By including multiple distinct portions within each doped region 114, 116, structure 100 may provide a larger contact area between doped regions 114, 116 and overlying regions 118, 120 thereon without otherwise affecting the surface area needed to provide structure 100.

Figure 4:
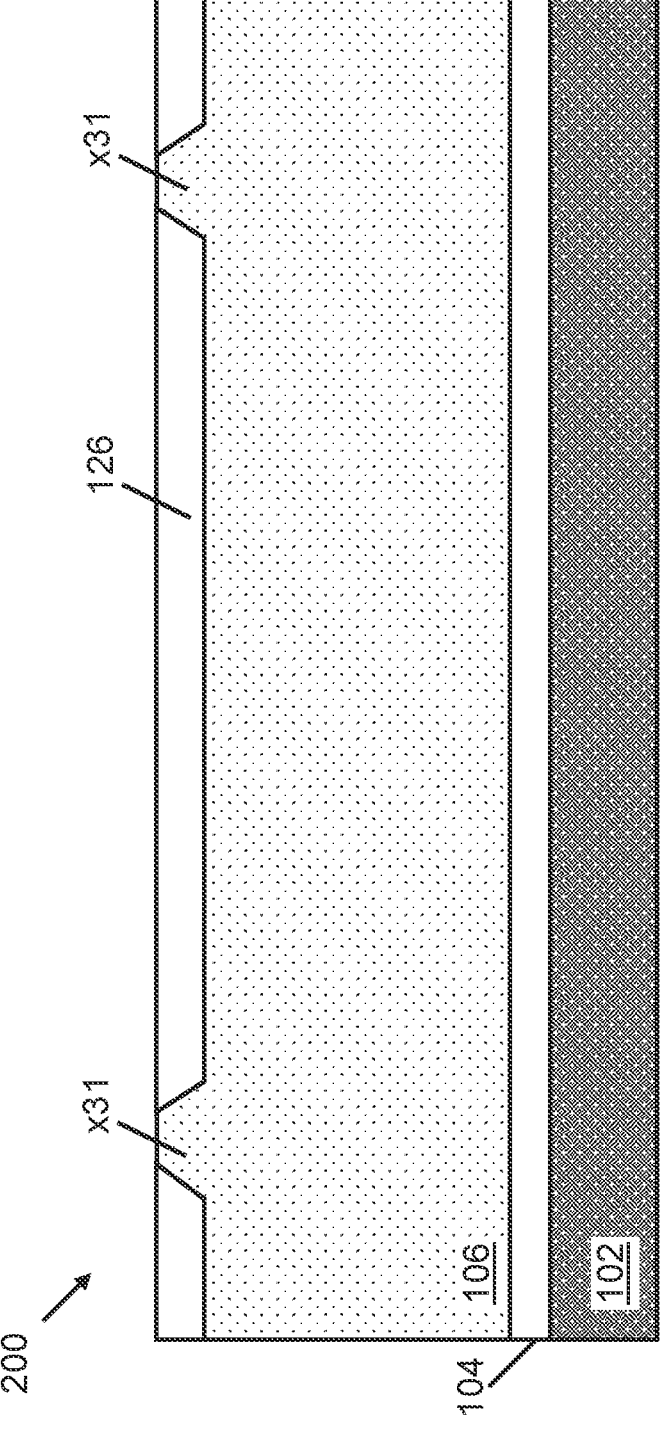
FIG. 4 depicts an initial structure to be processed according to embodiments of the disclosure.

Referring to FIG. 4, embodiments of the disclosure provide methods of forming structure 100 (FIGS. 1-3) in one or more of the configurations discussed herein. It is therefore understood that any one or more of the configurations and/or subcomponents thereof may be omitted, combined, etc., where desired to suit particular implementations. An initial structure 200 to be processed according to the disclosure may include, e.g., substrate 102, buried doped layer 104 on substrate 102, and first well 106 on buried doped layer 104. The forming and/or doping of substrate 102, buried doped layer 104, and first well 106 may be performed according to any currently known or later developed technique to form the above-noted materials in these positions (e.g., combinations of epitaxial growth with in-situ doping and/or implantation of dopants). Preliminary structure 200 additionally may include insulator layer 126 (e.g., in the form of trench isolation material and/or other similar insulative structures) on portions of first well 106 as discussed herein. In further implementations, insulator layer 126 may be formed together with additional silicide blocking layer 134 (FIG. 3) in cases where structure 100 will include multiple insulator layers 126 and/or silicide blocking layers 134. Preliminary structure 200 also may include a set of semiconductor areas within and adjacent insulator layer 126 at various positions, e.g., to enable the forming of doped terminals in further processing. Initially, first well 106 may be doped n-type as also discussed herein.

Figure 5:
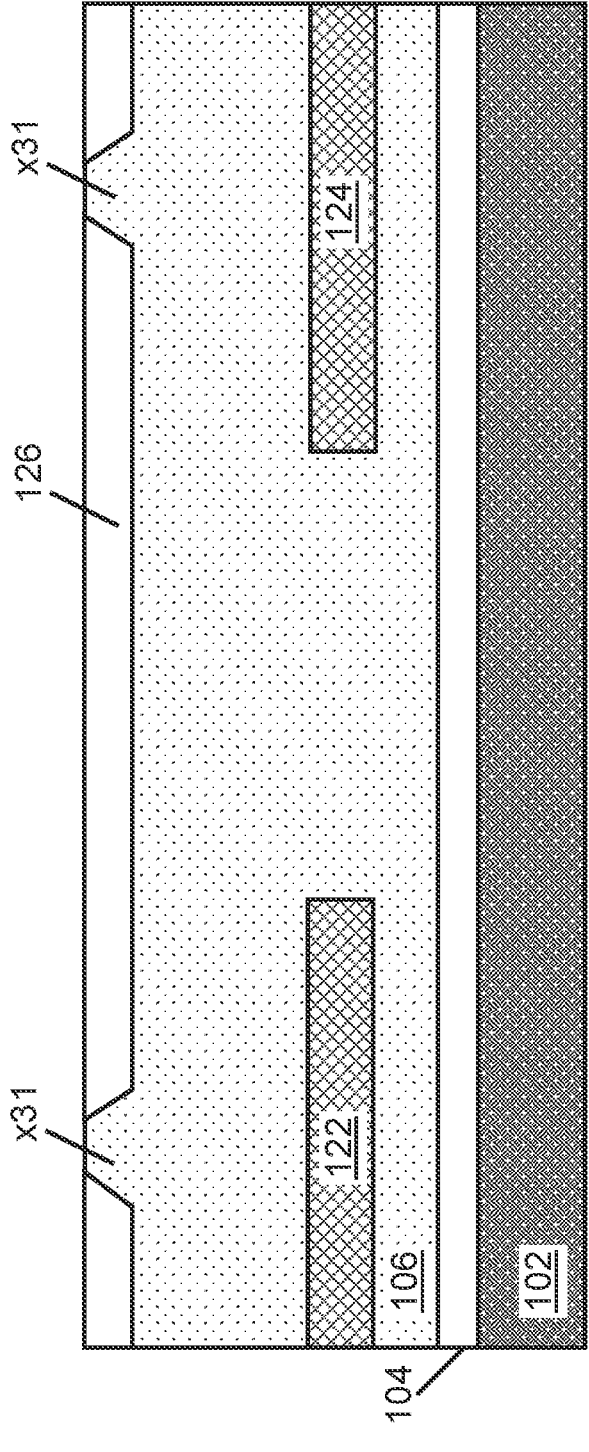
FIG. 5 depicts forming buried doped regions according to embodiments of the disclosure.

FIG. 5 depicts continued processing to form buried doped region(s) 122, 124 within first well 106. The forming of regions 122, 124 may include, e.g., introducing dopants of an opposite doping polarity relative to first well 106 into targeted portions of first well 106. Such doping may include, e.g., targeted implantation of p-type dopants such that regions 122, 124 are formed below the upper surface(s) of first well 106 but above the position of buried doped layer 104.

Figure 6:
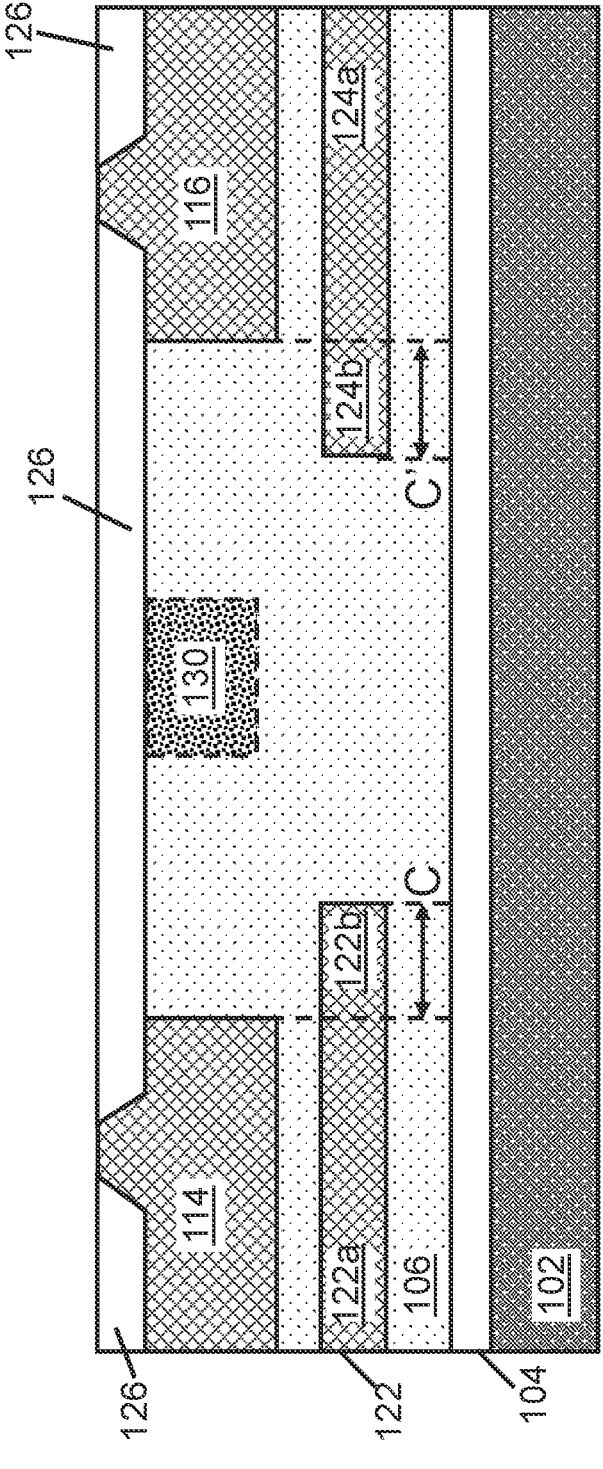
FIG. 6 depicts forming terminals over the buried doped regions according to embodiments of the disclosure.

FIG. 6 depicts further processing, e.g., by introducing additional dopants into first well 106 above the position of regions 122, 124 to form doped regions 114, 116. The forming of doped regions 114, 116 may be implemented by another instance of implanting or otherwise introducing dopants of a same doping type (e.g., p-type doping) into first well 106. The same dopants as first well 106 may be implemented at the upper surface of first well 106 and/or directly beneath portions of insulator layer 126 such that regions 114, 116 are defined within an upper portion of first well 106 and above regions 122, 124. As discussed elsewhere herein, doped regions 114, 116 may have less horizontal width than regions 122, 124. Thus, doped regions 114, 116 may vertically overlap only a portion (122*a*, 124*a*) of buried doped regions 122, 124. The forming of doped regions 114, 116 in first well 106 thus may define horizontal widths C, C' in structure 100. Further processing optionally may include additional doping of first well 106 to define second well 130 therein. Second well 130 may be doped with dopants of the same polarity as first well 106 to define a more highly doped region having an opposite doping type relative to doped regions 114, 116.

Figure 7:
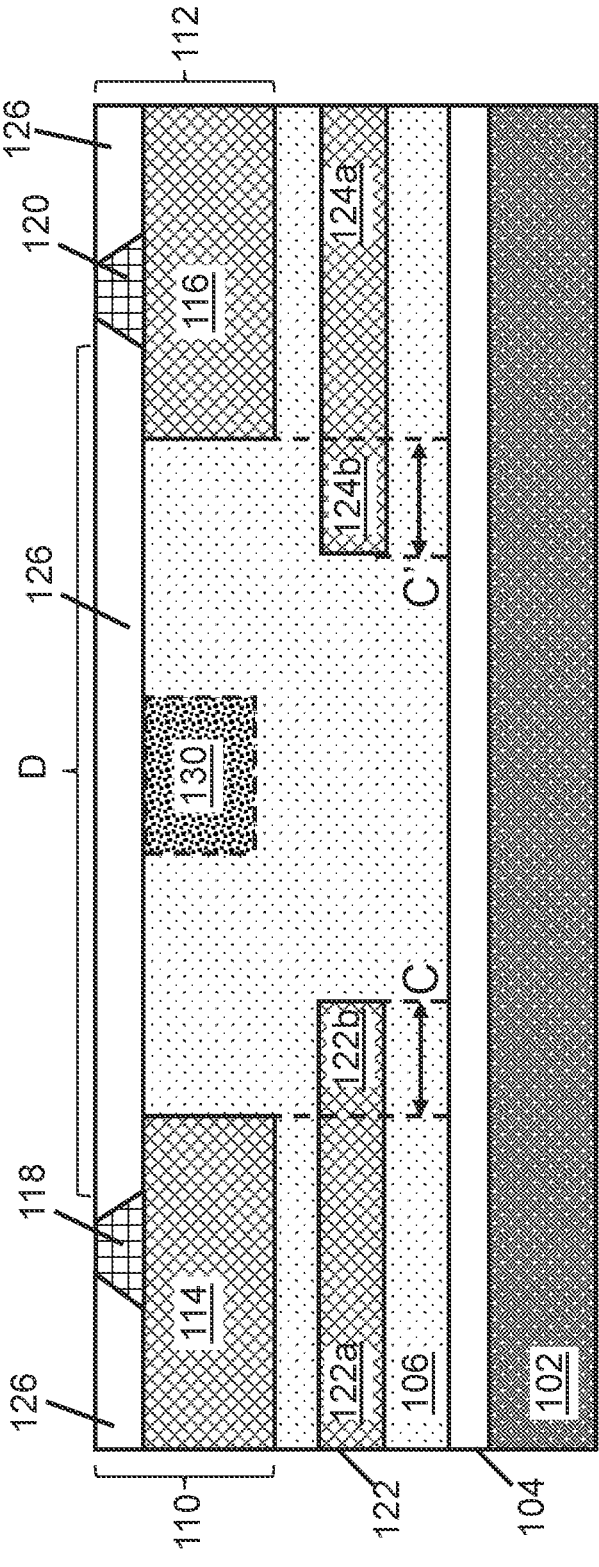
FIG. 7 depicts forming highly doped regions within the terminals according to embodiments of the disclosure.

FIG. 7 depicts continued processing, e.g., by further doping of regions 114, 116 to define overlying regions 118, 120. The forming of overlying regions 118, 120 may be implemented by additional targeted doping of regions 114, 116 such that excess dopants are provided above other portions of regions 114, 116. The forming of overlying regions 118, 120 may define first terminal 110 and second terminal 112 (FIGS. 1-3) over substrate 102 and within first well 106. Such doping, moreover, may define the alternating p-type and n-type doped regions to create P-N-P device D, discussed elsewhere herein. Further processing may include forming of metal wires or via(s) on overlying regions 118, 120 to define nodes T1, T2 (FIGS. 1-3). Nodes T1, T2 in turn may be coupled to supply voltage and ground terminals of a device to provide, e.g., a bypass line triggered only by at least a trigger voltage or current. Embodiments of structure 100 (FIGS. 1-3) thus are operable to provide an ESD protective structure when implemented in a device.

Embodiments of the disclosure provide various commercial and technical advantages, examples of which are discussed herein. Embodiments of structure 100 may define a P-N-P device D that is symmetrical, and thus capable of being triggered by sufficiently high positive or negative voltages. Moreover, the symmetric features of structure 100 reduce demand on surface area as compared to conventional ESD protective devices (e.g., those in which collector and emitter terminals have mismatched shapes and/or surface area occupied). These and other benefits may arise from including buried doped region(s) 122, 124 to extend the electric field(s) induced by applying a trigger voltage or current to terminal(s) 110, 112 during operation. Additionally, embodiments of the disclosure yield an unexpectedly high reduction in "on resistance" (i.e., the electrical resistance between terminal(s) 110, 112) in situations where P-N-P device D is triggered. These and other benefits can be realized without additional masks when fabricating embodiments of structure 100, e.g., because buried doped region(s) 122, 124 can be formed by increasing or modifying the doping process(es) implemented on conventional precursor materials.

The method and structure as described above are used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a center processor.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately," and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A structure comprising:
a semiconductor substrate including a first well;
a buried doped layer below the first well;
a first terminal including a first doped region in the first well, wherein the first well vertically separates the first terminal from the buried doped layer;
a second terminal including a second doped region in the first well, wherein the first well horizontally separates the first doped region from the second doped region, and the first well vertically separates the first terminal from the buried doped layer;
a first floating doped region within and wholly encapsulated by the first well such that the first floating doped region is overlapping with and underneath the first doped region, wherein the first floating doped region is vertically between the first doped region and the buried doped layer, the first well vertically separates the first floating doped region from the first doped region and the buried doped layer, and the first floating doped region is not coupled to or contacted by an electrical bias or ground; and
a second floating doped region within and wholly encapsulated by the first well such that the second floating doped region is overlapping with and underneath the second doped region, wherein the second floating doped region is vertically between the second doped region and the buried doped layer, the first well vertically separates the second floating doped region from the second doped region and the buried doped layer, the second floating doped region is not coupled to or contacted by the first terminal or the second terminal to an electrical bias or ground.

2. The structure of claim 1, wherein a portion of the first floating doped region does not vertically overlap with the first doped region.

3. The structure of claim 1, further comprising a second well within the first well and horizontally between the first doped region and the second doped region, wherein a dopant concentration within the second well is higher than a dopant concentration within the first well.

4. The structure of claim 1, wherein the first well is doped n-type, and the first doped region and the second doped region are doped p-type to define a P-N-P device between the first terminal and the second terminal.

5. The structure of claim 1, further comprising an insulator layer on the first well and extending horizontally from an upper portion of the first terminal to an upper portion of the second terminal.

6. The structure of claim 5, wherein a portion of the first well vertically separates the buried doped layer from the insulator layer.

7. The structure of claim 1, wherein a vertical thickness of the first well between the first floating doped region and the first doped region is between approximately 0.50 micrometers ($\mu$m) and approximately 1.5 $\mu$m.

8. A structure comprising:
a semiconductor substrate including a first well;
a buried doped layer below the first well;
a first terminal including a first doped region in the first well, wherein the first well vertically separates the first terminal from the buried doped layer;
a second terminal including a second doped region in the first well, wherein the first well horizontally separates the first doped region from the second doped region, and the first well vertically separates the first terminal from the buried doped layer;
a first floating doped region within and wholly encapsulated by the first well such that the first floating doped region is overlapping with and underneath the first doped region, wherein the first well vertically separates the first floating doped region from the first doped region and the buried doped layer, and the first floating doped region is not coupled to or contacted by an electrical bias or ground;
a second floating doped region within and wholly encapsulated by the first well such that the second floating doped region is overlapping with and underneath the second doped region, wherein the second floating doped region is vertically between the second doped region and the buried doped layer, and the first well vertically separates the second floating doped region from the second doped region and the buried doped layer, and the second floating doped region is not coupled to or contacted by the first terminal or the second terminal to an electrical bias or ground; and a second well within the first well and horizontally between the first doped region and the second doped region, wherein a dopant concentration within the second well is higher than a dopant concentration within the first well, and wherein the second well is floating.

9. The structure of claim 8, wherein a portion of the first floating doped region does not vertically overlap with the first doped region, and wherein a portion of the second floating doped region does not vertically overlap with the second doped region.

10. The structure of claim 8, wherein the first well is doped n-type, and the first doped region and the second doped region are doped p-type to define a P-N-P device between the first terminal and the second terminal.

11. The structure of claim 10, wherein the first floating doped region and the second floating doped region are doped p-type.

12. The structure of claim 8, further comprising an insulator layer on the first well and extending horizontally from an upper portion of the first terminal to an upper portion of the second terminal, wherein the insulator layer covers an upper surface of the second well.

13. The structure of claim 12, wherein a portion of the first well vertically separates the first floating doped region and the second floating doped region from the insulator layer.

14. A method comprising:

forming a semiconductor substrate including a first well and a buried doped layer below the first well;

forming a first terminal including a first doped region in the first well, wherein the first well vertically separates the first terminal from the buried doped layer;

forming a second terminal including a second doped region in the first well, wherein the first well horizontally separates the first doped region from the second doped region, and the first well vertically separates the first terminal from the buried doped layer;

forming a first floating doped region within and wholly encapsulated by the first well such that the first floating doped region is overlapping with and underneath the first doped region, wherein the first floating doped region is vertically between the first doped region and the buried doped layer, and the first well vertically separates the first floating doped region from the first doped region and the buried doped layer, and the first floating doped region is not coupled to or contacted by an electrical bias or ground; and forming a second floating doped region within and wholly encapsulated by the first well such that the second floating doped region is overlapping with and underneath the second doped region, wherein the second floating doped region is vertically between the second doped region and the buried doped layer, and the first well vertically separates the second floating doped region from the second doped region and the buried doped layer, and the second floating doped region is not coupled to or contacted by the first terminal or the second terminal to an electrical bias or ground.

15. The method of claim 14, further comprising forming a second well within the first well and horizontally between the first doped region and the second doped region, wherein a dopant concentration within the second well is higher than a dopant concentration within the first well.

16. The method of claim 14, further comprising forming an insulator layer on the first well and extending horizontally from an upper portion of the first terminal to an upper portion of the second terminal.

17. The method of claim 14, wherein forming the first floating doped region includes forming a portion that does not vertically overlap with the first doped region.

18. The structure of claim 3, wherein the second well is floating and an insulator layer covers an upper surface of the second well.

19. The method of claim 15, wherein the second well is floating and an insulator layer covers an upper surface of the second well.

* * * * *